United States Patent
Geng et al.

(10) Patent No.: US 6,222,205 B1
(45) Date of Patent: Apr. 24, 2001

(54) LAYERED SEMICONDUCTOR STRUCTURE FOR LATERAL CURRENT SPREADING, AND LIGHT EMITTING DIODE INCLUDING SUCH A CURRENT SPREADING STRUCTURE

(75) Inventors: Christian Geng, Heilbronn; Jochen Gerner, Wiesloch, both of (DE)

(73) Assignee: Vishay Semiconductor GmbH, Heilbronn (DE)

(*) Notice: Subject to any disclaimer, the term of this patent is extended or adjusted under 35 U.S.C. 154(b) by 0 days.

(21) Appl. No.: 09/154,727

(22) Filed: Sep. 16, 1998

(30) Foreign Application Priority Data

Sep. 20, 1997 (DE) .............................................. 197 41 609

(51) Int. Cl.$^7$ ..................................................... H01L 33/00
(52) U.S. Cl. ............................. 257/96; 257/94; 257/103
(58) Field of Search ................................. 257/103, 94, 96

(56) References Cited

U.S. PATENT DOCUMENTS

| | | |
|---|---|---|
| 5,132,750 | 7/1992 | Kato et al. . |
| 5,739,553 * | 4/1998 | Noto et al. . |

FOREIGN PATENT DOCUMENTS

| | | |
|---|---|---|
| 0551001 | 7/1993 | (EP) . |
| 0434233 | 3/1995 | (EP) . |

OTHER PUBLICATIONS

IEEE Journal of Quantum Electronics, vol. 31, No. 10, Oct. 1995 "High–Reflectivity Bragg Mirrors for Optoelectonic Applications", by S. S. Murtaza et al., pp. 1819–1825.

"High–Efficiency InGaAlp Visible Light–Emitting Diodes" by H. Sugawara et al., published in Jpn. J. Appl. Phys. vol. 31 (1992), pp. 2446 to 2451.

"Two–Fold Efficiency Improvement in High Performance ALGaInP Light Emitting Diodes . . . " by K. Huang et al. in Appl. Phys. Lett. 61(9), Aug. 31, 1992, pp. 1045 to 1047.

"Highly Reliable Operation of Indium Tin Oxide ALGaInP Orange Light–Emitting Diodes" by J. F. Lin et al., published in Electronics Letters, Oct. 13, 1994, vol. 30, No. 21, pp. 1793 to 1794.

(List continued on next page.)

*Primary Examiner*—Stephen D. Meier
(74) *Attorney, Agent, or Firm*—W. F. Fasse; W. G. Fasse

(57) ABSTRACT

In order to achieve lateral current spreading between a current injecting or current collecting surface of an electrode and an active surface of an active region in a semiconductor device such as a light emitting diode, a layered semiconductor heterostructure is arranged between the electrode and the active surface. The heterostructure includes at least two semiconductor layers forming a heterojunction therebetween, whereby the semiconductor layers are composed of different semiconductor materials or different compositional proportions of the same compound semiconductor. An enrichment region for the majority charge carriers is formed in one of the layers adjacent the heterojunction, and a majority charge carrier energy band discontinuity exists at the heterojunction. Each enrichment region provides a strong lateral current spreading effect, such that a stacked arrangement of plural heterojunction layer pairs brings about a strong step-wise lateral current spreading. The light output and efficiency of a light emitting diode is substantially improved by incorporating such a current spreading heterostructure.

33 Claims, 4 Drawing Sheets

OTHER PUBLICATIONS

Ibach and Lüth, Textbook entitled "Festkörperphysik: Einführung in die Grundlagen", "Solid State Physics: Introduction to the Basic Principles", Fourth Edition, published by Springer Verlag, 1995, pp. 368 to 381, and particularly pp. 372 to 397).

"Lehrbuch der Experimentalphysik", "Textbook of Experimental Physics" by Bergmann and Schaefer, edited by W. Raith, published by Walter de Gruyter and Co., 1992, vol. 6, p. 564.

"Spontane Mischkristallordnung in ALGaInP—Laserstrukturen", "Spontaneous Mixed Crystal Order in ALGaInP Laser Structures", by C. Geng, published by Shaker Verlag, Aachen, Germany, 1997, Chapter 6, pp. 95 to 127.

"Metal–(n) ALGaAs–GaAs Two–Dimensional Electron Gas FET" by D. Delagebeaudeuf et al. in IEEE Transactions on Electron Devices, vol. ED–29, No. 6, Jun. 1982, pp. 955 to 960.

"Polarization effect in light emitting diodes with ordered GaInP active layers" by Greger et al.; Appl.Phys. Lett.68(17) Apr. 22, 1996; pp. 2383–2386.

"GaAs/ALGaAs Light Emitters Fabricated on Undercut GaAs on Si"; Wada et al.; Jpn. J.Appl.Phys. vol.33(1994) pp. 1268–1274; Part 1, No. 3A, Mar. 1994.

* cited by examiner

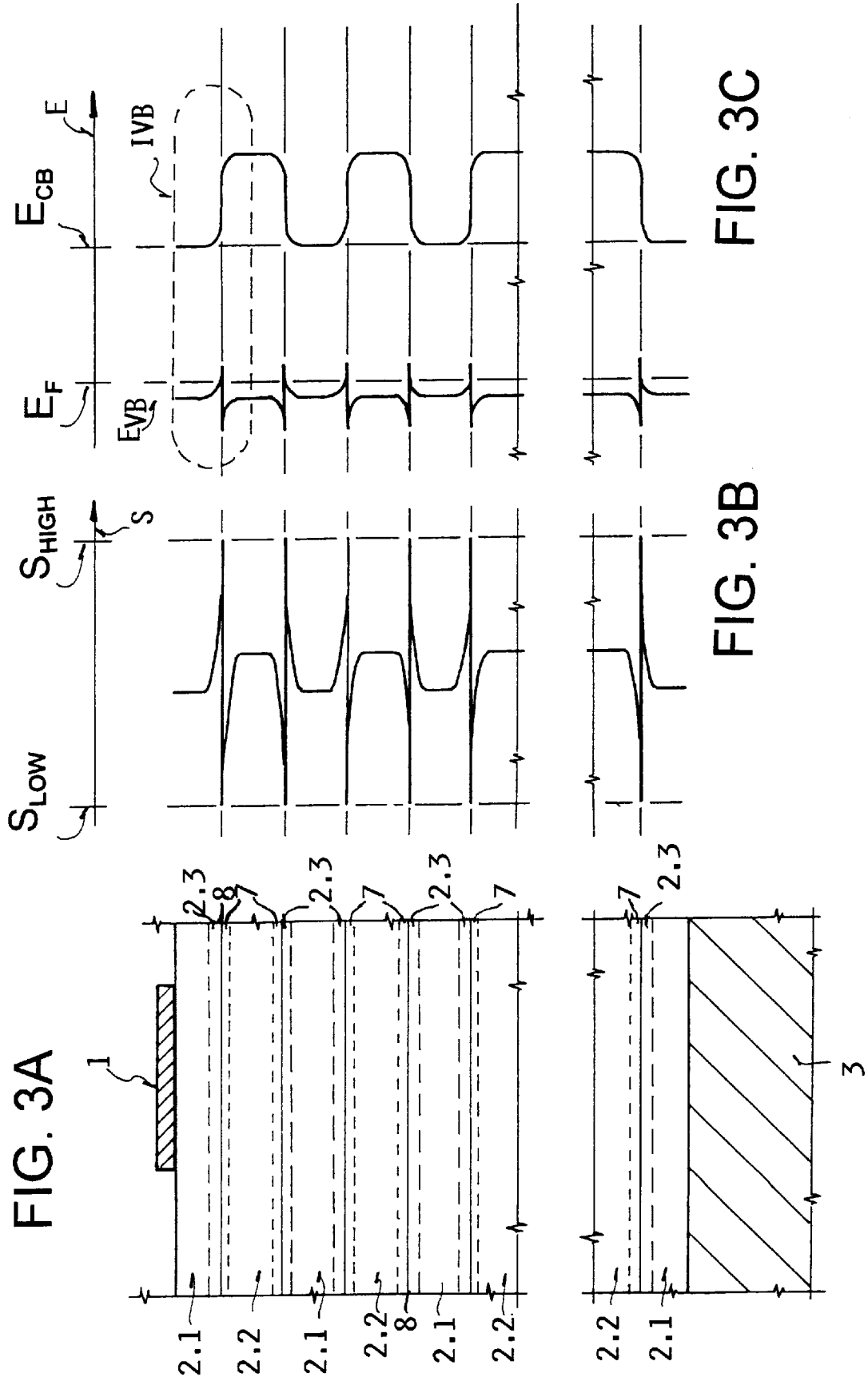

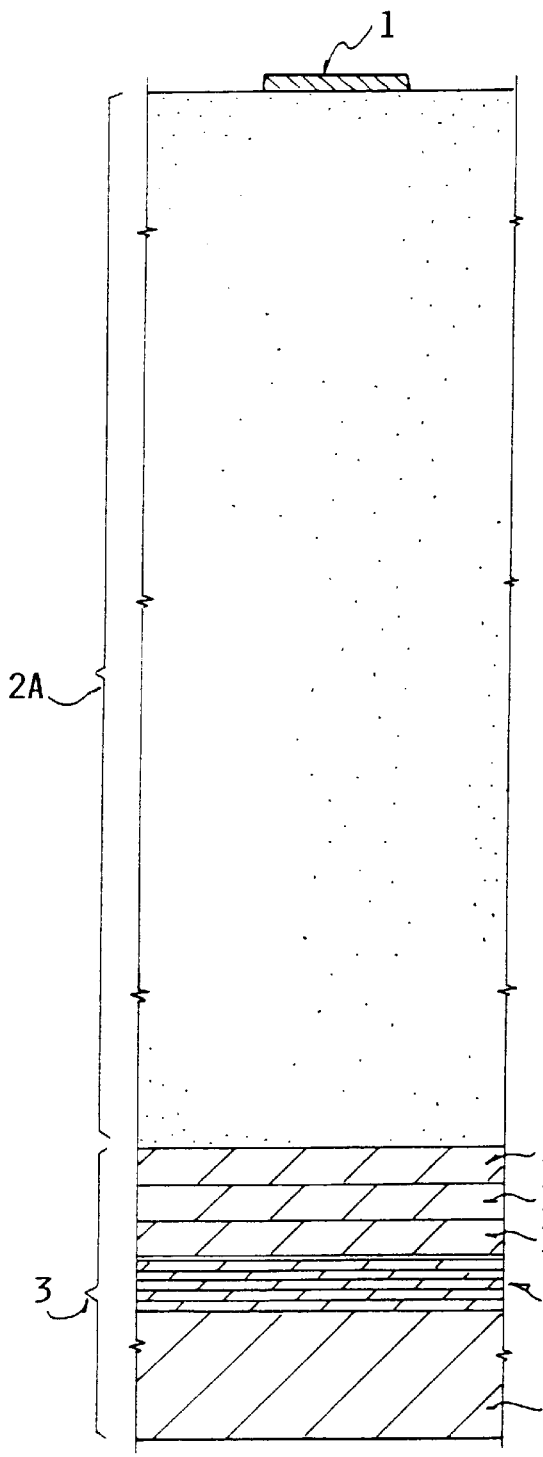
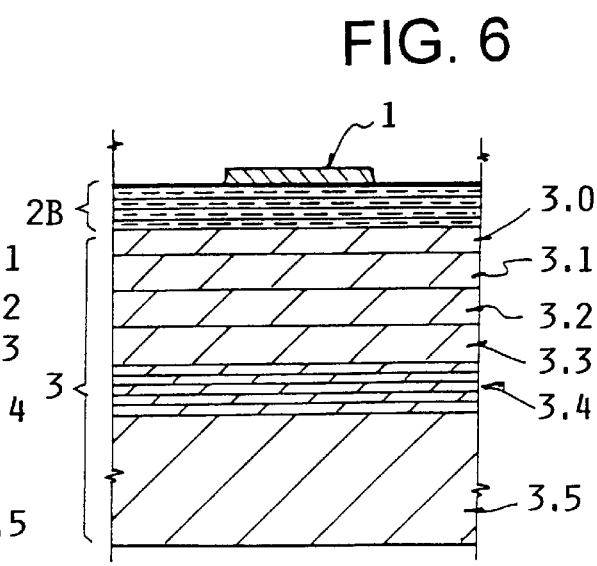

LAYERED SEMICONDUCTOR STRUCTURE FOR LATERAL CURRENT SPREADING, AND LIGHT EMITTING DIODE INCLUDING SUCH A CURRENT SPREADING STRUCTURE

PRIORITY CLAIM

This application is based on and claims the priority under 35 U.S.C. §119 of German Patent Application 197 41 609.8, filed on Sep. 20, 1997, the entire disclosure of which is incorporated herein by reference.

FIELD OF THE INVENTION

The invention relates to a structure of semiconductor layers for conducting and laterally spreading a current between a current injection surface or current collecting surface of an electrode and an active area surface arranged parallel thereto, wherein the electrode surface has a different, e.g. smaller, surface area than the active area surface. The invention further relates to a semiconductor light emitting diode incorporating such a current spreading structure.

BACKGROUND INFORMATION

It is a well known dilemma in the field of semiconductor devices, that on the one hand a current flow should be distributed as uniformly as possible over the entire active region surface of a semiconductor device such as a light emitting diode (LED), while on the other hand, the current injecting electrode or contact should be made as small as possible, i.e. covering the smallest portion of the active region surface as possible, to avoid blocking or reflecting the light emitted from the active region and for reasons of costs and complexity. The same holds true for current injecting electrodes or contacts on the surface of, or internally within, semiconductor devices other than LEDs, and also applies to current collecting electrodes. In general, the electrode surface is any current carrying surface such as a contact surface that is connected to a bonding wire or the like.

In view of the above dilemma, certain problems arise. Namely, when using an electrode surface that is smaller than the associated active region surface, the current flow becomes "crowded", i.e. the current density is highest, directly under the electrode surface and diminishes laterally away from the electrode surface. Moreover, since the electrode surface acts as a reflecting screen for the emitted light (e.g. in the case of an LED), it is especially important that a good current density is provided to the areas of the active region surface laterally away from the electrode surface. Therefore, it is a well known problem to provide lateral current spreading between the electrode surface and the active region surface.

Several different structural arrangements have been proposed in the prior art for achieving the desired lateral current spreading. Published European Patent Specification 0,434,233 (Fletcher et al.) discloses one possible solution for LEDs, wherein a relatively thick transparent window layer having a lower electrical resistivity than the active layers is arranged between the electrode surface and the active region surface. Particularly, the transparent window layer has a band gap greater than the band gap of the active layers and a resistivity at least an order of magnitude less than that of the active layers. A metal contact or electrode layer is formed over a portion of the surface of the transparent window layer. This published reference discloses that thicker window layers tend to be desirable, and layer thicknesses in the range from 2 to 30 $\mu$m are suitable, while thicknesses in the range from 5 to 15 $\mu$m are preferred.

Published European Patent Application 0,551,001 (Fletcher et al.) similarly discloses the use of a thick transparent layer arranged over the active region of an LED. This reference discloses the quasi-conical current spreading effect of such a uniform, thick, transparent window layer. The window layer is purposely rather thick, to avoid or minimize the internal reflection of the light emitted from the active region. The thickness is determined as a function of the width of the window layer and the critical internal reflection angle.

The article "High-Efficiency InGaAlP Visible Light-Emitting Diodes" by H. Sugawara et al., published in Jpn. J. Appl. Phys. Vol. 31 (1992), pages 2446 to 2451 also discloses an LED structure including a current spreading layer having a thickness of 7 $\mu$m (see page 2449). FIG. 4 of this article clearly shows the improvement in total light emission or light emission efficiency when using the GaAlAs current spreading layer as compared to a structure without such a current spreading layer.

The article "Two-Fold Efficiency Improvement in High Performance AlGaInP Light Emitting Diodes . . . " by K. Huang et al. in Appl. Phys. Lett. 61(9), Aug. 31, 1992, pages 1045 to 1047, also discloses a thick window layer for achieving current spreading, wherein the window layer thickness is particularly in the range from 9 to 63 $\mu$m, and especially 45 $\mu$m. Once again, the window layer thickness is defined in view of the light reflection effects.

A substantial disadvantage of all of the above mentioned conventional thick window layers is that the window layer has a substantially greater thickness than the active layers, which typically have thicknesses less than 1 $\mu$m. This very great thickness of the window layer leads to a high material consumption for forming the window layer, and also requires a very long time for carrying out the epitaxial growth using conventional equipment. While it is possible to use more complicated and more expensive equipment for carrying out the epitaxial growth more quickly, it is still not possible to reduce the material consumption and costs, and the equipment costs are increased even further.

The article "Highly Reliable Operation of Indium Tin Oxide AlGaInP Orange Light-Emitting Diodes" by J. F. Lin et al., published in Electronics Letters, Oct. 13, 1994, Vol. 30, No. 21, pages 1793 to 1794 discloses a current spreading window layer made of indium tin oxide (ITO). The disclosed ITO current spreading layer is 600 Å thick. Disadvantageously, the production costs and material costs of an LED incorporating such an ITO current spreading layer are even considerably higher than conventional LEDs or LEDs with the above mentioned thick window layers.

SUMMARY OF THE INVENTION

In view of the above, it is an object of the invention to provide a layered semiconductor structure for achieving lateral current spreading, which can be manufactured by relatively simple process technologies, which is cost-economical with regard to the materials and the processes, and which achieves the required current spreading or even improves the current spreading beyond that which could be achieved in the prior art, and in a more compact structure than was possible in the prior art. It is a further object of the invention to provide a semiconductor light emitting diode (LED) incorporating such a layered semiconductor current spreading structure, whereby the LED achieves a very good light power output and efficiency due to the improved lateral current spreading, and wherein the LED may be manufactured in a simple and cost-economical manner. The invention further aims to overcome or avoid the disadvantages of the prior art, and to achieve additional advantages, as apparent from the present description.

The above objects have been achieved in a layered semiconductor current spreading structure according to the invention, wherein the current spreading structure is arranged between an electrode surface, such as a current injection surface of an electrical contact, and an active region surface, which is larger than the electrode surface and arranged parallel to the electrode surface for example. Particularly according to the invention, the layered semiconductor current spreading structure comprises at least one pair of parallel adjacent semiconductor layers that have different material characteristics so as to form a heterojunction therebetween. Namely, the two layers of each pair are made of different semiconductor materials or compound materials having the same elemental components in different composition ratios. Another related feature is that the two layers of each heterojunction layer pair respectively comprise different energy band gaps. A majority charge carrier energy band discontinuity is formed across the heterojunction, and an enrichment region for the majority charge carriers is formed in at least one of the semiconductor layers adjacent to the heterojunction.

The above objects have further been achieved according to the invention in a semiconductor light emitting diode (LED) that includes an optically active light emitting layer, an electrical contact or electrode, and the inventive layered current spreading heterostructure arranged between the electrode and the optically active layer. The band gap or band gaps of the current spreading heterostructure are greater, i.e. have a higher energy level, than the band gap or band gaps of the optically active layer. The paired semiconductor layers forming the heterojunction therebetween are isotypic doped semiconductor layers made of different semiconductor materials or different composition proportions of the same elemental components. The further features of the layered semiconductor current spreading heterostructure according to the invention apply to the present LED as well.

The current injection surface or current emitting surface can be the contact surface of a contact pad on the semiconductor device, can be a metallization layer connected to the contact pad, which is arranged on the upper surface of a semiconductor diode, for example. However, it should further be understood that the current spreading function achieved by the present inventive structure can also be applied to devices other than LEDs. For example, the present inventive arrangement is also applicable to solar photovoltaic cells, in which the corresponding electrode surface can be a current collecting electrode on the upper surface of the solar cell, whereby the current spreading function is actually an inverse or current collecting and concentrating function. The present inventive arrangement also applies to any current emitting or current collecting surface in a region within the semiconductor material of a semiconductor device, in other words the electrode surface is not limited to electrodes applied to the exterior surfaces of devices. In any event, the present inventive current spreading structure is particularly applicable in situations in which the electrode surface is smaller than the active region surface to which current is to be distributed, because it is in such situations that the current density will be significantly higher directly under the electrode surface than laterally away from the electrode surface, so that there is a need for the current spreading function.

It is generally known from solid state physics theory, that an enrichment region of majority charge carriers will be formed in at least one of the semiconductor layers at or adjacent a heterojunction between two semiconductor layers of different materials or material composition proporations (see e.g. Ibach and Lüth, Textbook entitled "Festkörperphysik: Einführung in die Grundlagen", "Solid State Physics: Introduction to the Basic Principles", Fourth Edition, published by Springer Verlag, 1995, pages 368 to 381, and particularly pages 372 to 374). A condition in this context is that the different materials of the two semiconductor layers are characterized by different band gaps, so that equilibrating or maintaining the continuity of the Fermi level across the heterojunction will lead to the formation of a space charge enrichment region for the majority charge carriers and a corresponding energy band discontinuity on the side of the semiconductor layer having the lower band gap.

In the present application of such a heterojunction for achieving a current spreading effect, it is particularly advantageous to provide as large a discontinuity in the majority charge carrier band as possible, because the resulting space charge enrichment region will contain a corresponding large quantity of majority charge carriers in the form of a quasi- or pseudo- free electron gas. Thereby, it is advantageous for the current spreading function that the space charge enrichment region is formed over the entire heterojunction between the two semiconductor layers, and with a correspondingly large band discontinuity over the entire heterojunction, which leads to a very good two-dimensional mobility of the majority charge carriers along the heterojunction. This effect has been referred to as a two-dimensional electron gas in the context of two different n-doped semiconductor material layers (see the Ibach and Lüth Textbook referenced above, at page 374).

If the discontinuity in the majority charge carrier band, which is the valence band for p-doped semiconductor layers or the conduction band for n-doped semiconductor layers, becomes very small or approaching zero, which is the case in certain individual type II heterojunctions, then a sufficient enrichment of the majority charge carriers will not be achieved due to the very small or totally lacking band discontinuity, i.e. equilibration of the Fermi level will not cause a sufficient transfer of majority charge carriers from one of the layers to the other. Instead, an enrichment of the minority charge carriers may arise to a much lesser degree, which would not have any appreciable improvement in the current spreading effect, although in principle such an effect would also be expected to occur in this context.

However, in the prior art, the effect of the two-dimensional freely mobile electron gas has only found very limited application, and particularly in the active layers, of LEDs. One known application in the active layer of LEDs is for achieving so-called potential wells on the basis of quantum effects, and particularly for multiple quantum well structures, as described in the "Lehrbuch der Experimentalphysik", "Textbook of Experimental Physics" by Bergmann and Schaefer, edited by W. Raith, published by Walter de Gruyter and Co., 1992, Vol. 6, page 564. Another application of the two-dimensionally freely mobile electron gas is as modulation doped heterojunctions in the active layer, as described by the above referenced Textbook of Ibach and Lüth on page 373 et. seq. In this context, the high mobility of the two-dimensional electron gas is not utilized. The use of quantum films serves to modify the density of states and offers the possibility of producing the material as a pseudomorph under stress, which can especially be advantageously used in laser diodes, as described in the doctoral dissertation entitled "Spontane Mischkristallordnung in AlGaInP - Laserstrukturen", "Spontaneous Mixed Crystal Order in AlGaInP Laser Structures", by C. Geng (one of the present inventors), published by Shaker Verlag, Aachen, Germany, 1997, Chapter 6, pages 95 et seq.

However, the further effects described above are inconsequential for improving the current spreading effect, and corresponding measures, such as the targeted selection of doping quantities or of suitable band gaps of the two semiconductor layers, can have a positive influence on the effectiveness of the current spreading but are not absolutely necessary. The doping may be isotypic as well as differentiated (p-n, p-i-n). The effect of a two-dimensional electron gas has further been described in a pn-heterojunction in the context of a so-called TEG-FET (two-dimensional electron gas field effect transistor), which has a low noise characteristic (see "Metal-(n) AlGaAs-GaAs Two-Dimensional Electron Gas FET" by D. Delagebeaudeuf et al. in IEEE Transactions on Electron Devices, Vol. ED-29, No. 6, June 1982, pages 955 to 960). As was proved therein for so-called HEMTs (high electron mobility transistors), the mobility of the charge carriers can be further improved by an i-n heterojunction, whereby the intrinsic semiconductor material must have the lower band gap. If instead the intrinsic material were selected to have a higher band gap than that of the n-doped material, then an enrichment region for the majority charge carriers would not be achieved, as can be demonstrated using the known band gap model. Moreover, in the context of the HEMTs, only the aspect of the improved frequency characteristic of these transistors was examined, and the lateral current spreading effect was unimportant. To the contrary, according to the present invention, heterojunction layer pairs or stacks with isotypic doping and a high discontinuity in the majority charge carrier band achieve or provide a very good lateral current spreading effect.

By arranging a plurality of such heterojunction layer pairs stacked one on top of another, the lateral current spreading effect will be further improved. A further advantage can be achieved by the particular effect of a so-called superlattice, as identified by the above referenced Textbook of Ibach and Lüth on page 374 for use in modulation doped heterostructures. In this context, the number of the space charge enrichment regions for the majority charge carriers is increased by the factor 2n-1, where n is the number of layer pairs, because, for example, each semiconductor layer that is surrounded from above and from below by another respective semiconductor layer having a larger band gap will comprise such a space charge enrichment region for the majority charge carriers both on its upper surface as well as on its lower surface. In other words, since each semiconductor layer having a lower band gap in the alternating stack of semiconductor layers will develop a space charge enrichment region of majority carriers along its upper surface and along its lower surface, there will be a total of 2n-1 of these space charge enrichment regions. Since the lateral current spreading effect is most pronounced in these space charge enrichment regions, the overall current spreading effect will be significantly improved by the alternating stacked arrangement of such heterojunction-forming layers.

The total number of the semiconductor layers that are pair-wise stacked on top of or adjacent one another in such a manner is ultimately limited by the total electrical resistance of the overall stacked structure, which increases with the number of layers included in the structure. An optimum balance between the current spreading effect and the overall resistance of the layered or stacked structure is achieved with from 10 to 20 layer pairs.

Preferably, the two layers of the heterojunction pairs are made of semiconductor materials or material mixtures comprising the same chemical atomic components or a subset of the chemical atomic components that are used in the underlying semiconductor layers. In other words, no additional or different elemental components need to be introduced for forming the semiconductor layers of the heterojunction pairs as compared to the other semiconductor layers of the device. Therefore, the entire device structure including the active layers as well as the layers of the current spreading structure can be formed in a single quasi-continuous production process using a single conventional epitaxial growth apparatus, without requiring re-equipping, re-configuration, or provision of additional semiconductor material sources, because it is simply necessary to regulate the source materials being provided, or the mixing ratios of the source materials as necessary during the process in order to form the different layers. The necessary accuracy or precision in the subsequent doping and in the mixing ratios that determine the band gaps may be easily achieved by state of the art technology.

A light emitting diode incorporating such a layered semiconductor structure for lateral current spreading according to the invention achieves a very good light emission output and efficiency, and may be manufactured in a very simple and inexpensive manner. The particular arrangement of the LED and the current spreading structure have been mentioned above.

BRIEF DESCRIPTION OF THE DRAWINGS

In order that the invention may be clearly understood, it will now be described in connection with example embodiments, with reference to the drawings, wherein:

FIG. 3A is an enlarged schematic partial sectional view of the detail area IIIA of FIG. 1;

FIG. 3B is a graph schematically representing the electrical conductivity characteristic through the layered structure of FIG. 3A;

FIG. 3C is a graph schematically representing the valence band and the conduction band characteristic through the layered structure of FIG. 3A;

FIG. 5 is a schematic sectional view of an LED with a transparent conductive window layer for lateral current spreading according to the prior art; and FIG. 6 is a schematic sectional view of an LED with a superlattice of a layered stack of heterojunction layers for achieving lateral current spreading according to the invention, having the same effective area of the active region surface, and a significantly reduced thickness of the current spreading structure in comparison to the prior art of FIG. 5.

DETAILED DESCRIPTION OF PREFERRED EXAMPLE EMBODIMENTS AND OF THE BEST MODE OF THE INVENTION

Figures 1, 2:
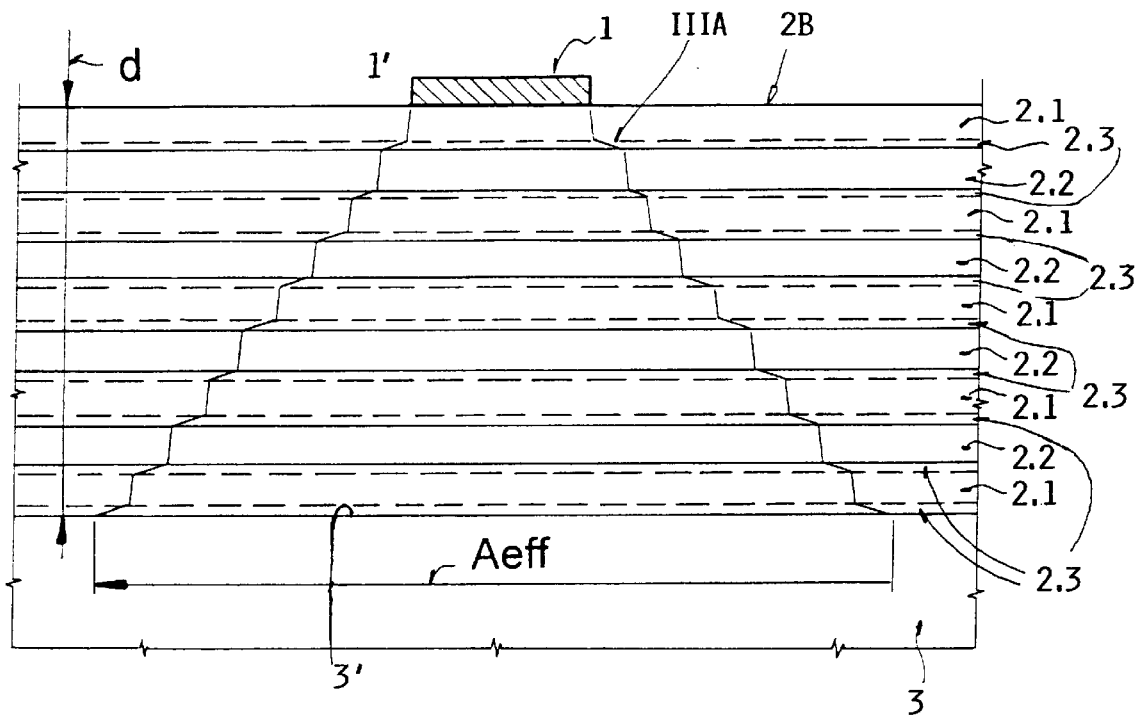
FIG. 1 is a schematic sectional view of a layered semiconductor structure including stacked heterojunction layer pairs according to the invention, schematically showing the step-wise lateral current spreading effect that is achieved.
FIG. 2 is a view similar to that of FIG. 1, but showing the substantially uniform and continuous current spreading effect achieved by a uniform semiconductor window layer according to the prior art.

FIG. 1 shows the step-wise lateral current spreading effect in a heterostructure 2B comprising a sequence or stack of semiconductor layers forming heterojunctions 8 therebetween, arranged between the electrode surface 1' of an electrode or contact 1 and an active region surface 3' of an active region 3. The effective area of the active region surface 3' through which current flows is indicated in a simplified one-dimensional manner by the width $A_{eff}$, whereby it should naturally be understood that the current spreading effect in the three-dimensional space of the heterostructure 2B actually expands outwardly in a quasi-pyramid shaped manner from the electrode surface 1' of the contact 1 to the surface 3' of the active region 3.

The heterostructure 2B comprises a sequence or stack of alternating individual semiconductor layers 2.1 and 2.2 having respective different band gaps, which is achieved by making the respective layers 2.1 and 2.2 of different semiconductor materials or different proportional compositions in mixed crystalline or compound semiconductor materials. In this heterostructure 2B, a majority charge carrier enrichment region and thus a current channel 2.3 is formed in each layer 2.1 respectively at its upper surface and its lower surface adjoining the other layers 2.2, and a respective heterojunction 8 is formed at each interface between the layers 2.1 and 2.2. The heterostructure 2B in this embodiment has four heterojunction layer pairs, i.e. four sets of layers 2.1 and 2.2, stacked to a total thickness or height d. Each layer 2.1 or 2.2 preferably has a thickness between 20 nm and 200 nm, with the total stack height d preferably being not greater than 5 μm and especially about 1 μm (e.g. 1 μm ±5%).

Due to the above structure, the charge carriers representing the current flow between the electrode surface 1' of the contact 1 and the active surface 3' of the active region 3 will successively come into a region of very good conductivity, namely the enriched region 2.3, followed by a region of lower conductivity, so that the current flow has a tendency to spread out laterally along the regions of higher conductivity. As a result, the current distribution or current spreading pattern is not a linear expansion, but rather a step-wise expansion with strong laterally drifting steps, so that the current spreading effect is considerably improved.

In comparison to FIG. 1, FIG. 2 shows the current spreading effect in a conventional semiconductor window layer 2A having the same thickness or height d as the above described inventive layered structure 2B. The current spreading progresses linearly, uniformly and continuously, and over the same layer thickness d only expands to an effective current flow surface area $A_{eff}'$ of the active region surface 3' that is considerably smaller than the effective area $A_{eff}$ in FIG. 1 according to the invention. In the conventional arrangement according to FIG. 2, the semiconductor layer 2A consists of a single uniform thick semiconductor layer, in contrast to the layered heterostructure 2B according to the invention as shown in FIG. 1. The formation or deposition of the layers 2.1 and 2.2 according to FIG. 1, or the single thick layer 2A according to FIG. 2, may be carried out reliably by means of metal-organic vapor phase epitaxy (MOVPE), within the level of ordinary skill in the art.

FIGS. 3A, 3B and 3C show the layered heterostructure 2B according to the invention, along with the electrical conductivity characteristic and the energy band model of the heterojunction layers. The layered heterostructure 2B shown in FIG. 3A comprises a stack of alternating semiconductor layers 2.1 having a relatively lower band gap and semiconductor layers 2.2 having a relatively higher band gap, arranged from the current injection electrode surface 1' of the electrode 1 to the active region surface 3'. FIG. 3B illustrates the varying electrical conductivity through the layered heterostructure, which deviates or fluctuates between a very good conductivity $S_{high}$ in each charge enrichment region 2.3 and a very poor or low conductivity $S_{low}$, in charge depletion regions 7 formed near the surfaces of the semiconductor layers 2.2 adjacent the layers 2.1.

Although the average overall conductivity of the layered heterostructure 2B might be slightly lower, i.e. the overall average resistivity and the total resistance of the layered heterostructure 2B might be slightly greater, than that of a single semiconductor layer 2A having the same thickness, this undesirable effect can be minimized to the point of being negligible by appropriately limiting the total number of heterojunction layers, for example to the maximum range of 10 to 20 as described above. In addition, it has to be taken into account, that the overall thickness is much lower, which also compensates this effect. Moreover, the respective local regions of increased conductivity, i.e. the charge enrichment regions 2.3 respectively extending entirely along each heterojunction 8, cause a very pronounced lateral spreading of the current flow, which is only insignificantly influenced by the reduced conductivity of the charge depletion region 7 in the adjoining semiconductor layer 2.2. This effect can be further understood in connection with FIG. 4A as described below. FIG. 3C shows the energy band model of the heterostructure 2B, including the respective energy level characteristics of the valence band $E_{VB}$, of the Fermi level $E_F$, and of the conduction band $E_{CB}$. From these energy bands, the arrangement or sequence of the enrichment regions 2.3 and depletion regions 7 can be more clearly seen. In this example embodiment, both semiconductor layers 2.1 and 2.2 are p-doped, whereby the Fermi level is near the valence band.

Figure 4B:
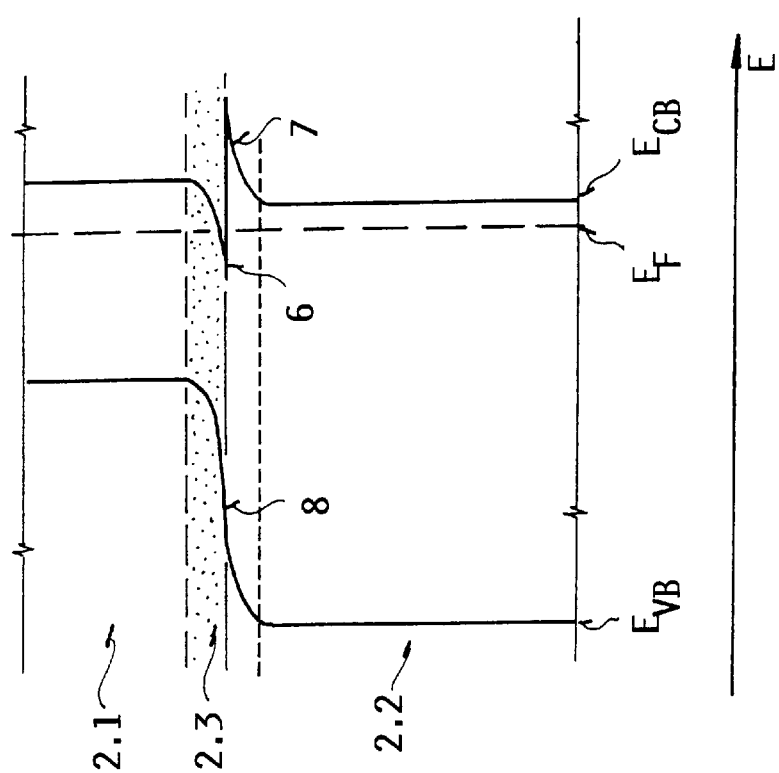
FIG. 4B is an enlarged detail view of the heterojunction area shown in FIG. 4A, but illustrating the discontinuity in the band model and showing the majority carrier enrichment region along the heterojunction, here for the example of n-conduction.
Figure 4A:
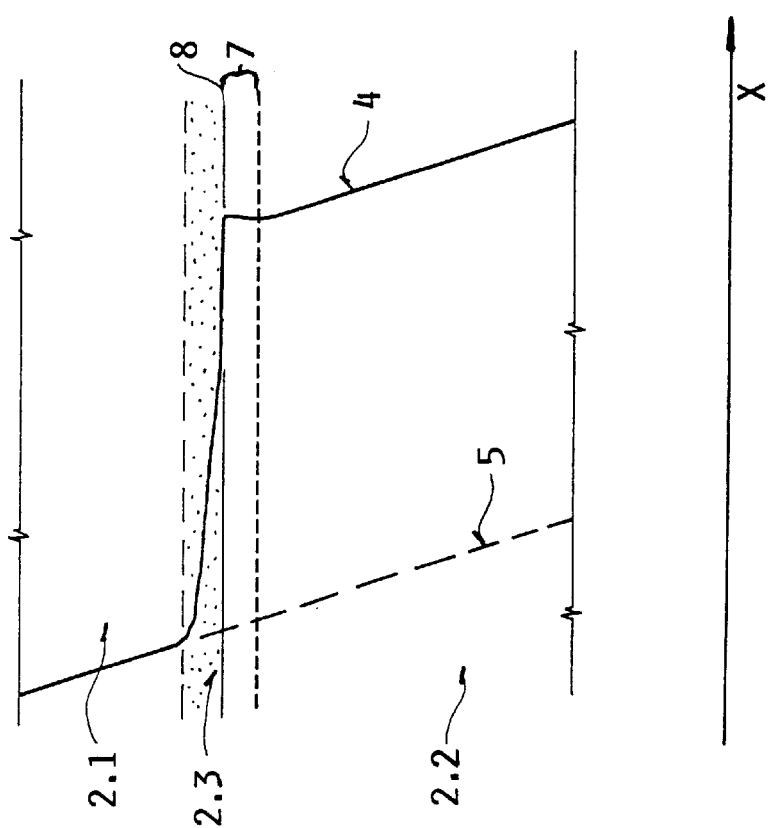
FIG. 4A is an even more enlarged detailed portion of the detail area IIIA of FIG. 1, showing the step-wise lateral current spreading effect at a heterojunction.

FIG. 4A once again shows the current spreading effect in even greater detail, in the area of a single heterojunction 8, and FIG. 4B shows the corresponding discontinuity of the energy band model as well as the majority charge carrier enrichment region. Thus, FIG. 4A shows the lateral current spreading effect 4 according to the invention through the provision of a heterojunction 8 and an adjoining enrichment region 2.3, in contrast to the normal or conventional, uniform linear current spreading effect 5 that would be achieved in a uniform single layer of semiconductor material without the two-dimensional current channel 2.3. Accordingly, the conventional linear current spreading effect 5 is illustrated by a dashed line. It is clearly visible in FIG. 4A that a very strong lateral current drift arises along the heterojunction 8 and particularly directly adjacent the side thereof provided with an enrichment region 2.3 of majority charge carriers. Directly thereadjacent, a depletion region 7 is characterized by an essentially low current spreading effect, and thereafter the current spreading characteristic through the body of the semiconductor layer 2.2 corresponds to the current spreading characteristic 5 that would prevail in a single uniform semiconductor layer.

If one further considers the energy band model shown in FIG. 4B, the discontinuity of the majority charge carriers becomes evident, here in the context of an enrichment of electrons for n-doped materials. Thereby, the discontinuity 6 may even reach or exceed the Fermi level $E_F$, whereby the number of free majority charge carriers sharply increases. Nonetheless, even with only a small discontinuity, a significant lateral current spreading effect along the heterojunction 8 can already be observed, if however not as strong as would be the case in a two-dimensional freely mobile electron gas. Preferably, the discontinuity has a magnitude of at least 150 meV. The depletion region 7 located across from the enrichment region 2.3 does not have a significant influence on the current spreading effect, but simply slightly increases the total resistance of the layered heterostructure 2B.

FIGS. 5 and 6 viewed together illustrate a comparison of two different devices that have substantially the same overall function or effect. Namely, FIG. 5 shows an LED device with a conventional uniform, thick window layer 2A for current spreading, and FIG. 6 shows an LED device with a layered heterostructure 2B according to the invention for current spreading. The total achieved degree of current spreading is the same in FIGS. 5 and 6, but the layer thickness needed for achieving that degree of current spreading is much smaller according to the invention in FIG. 6 than according to the prior art in FIG. 5.

The respective layers of the active region 3 of the two devices in FIGS. 5 and 6 substantially correspond to one another, whereby the upper cladding layer 3.1, the active region 3.2, the lower cladding layer 3.3, the reflection layer 3.4, and the substrate 3.5 are identical in both devices. The only difference in the active portion of the inventive device is that a transition layer 3.0 has been added for the purpose of lattice-matching between the active region and the layered heterostructure 2B. In the present example embodiment, the LED devices in FIGS. 5 and 6 comprise AlGaInP semiconductor active layers that are deposited in a lattice-matched manner onto respective GaAs substrates 3.5. The reflection layer 3.4, such as a so-called Bragg reflector made up of alternating $(Al_xGa_{1-x})As$ layers with n-doping and different compositions, is arranged adjoining the substrate 3.5. The individual layers of the Bragg reflector 3.4 respectively have a thickness of $\lambda/4$, whereby $\lambda$ is the wavelength of the emitted light, so that emitted light radiated toward the substrate is reflected from the reflector 3.4 back upward into the active material. This basic effect is generally described in the article by Murtaza et al. in the IEEE Journal of Quantum Electronics, Vol. 31, No. 10, October 1995, pages 1819 et. seq.

In both FIGS. 5 and 6, the lower cladding layer 3.3 consists of lattice matched $(Al_yGa_{1-y})InP$, which is also n-doped. The compositional subscript y is selected so that the band gap of the cladding layer 3.3 is higher than that of the active region 3.2 or the energy level of the emitted light, so that the cladding layer 3.3 is substantially transparent for the emitted light. In this embodiment, the active region 3.2 itself is undoped and may consist of a single layer of $(Al_zGa_{1-z})InP$ or of plural $(Al_aGa_{1-a})InP$ quantum films with respective $(Al_bGa_{1-b})InP$ barriers, whereby $0 \leq a \leq b \leq 1$. Arranged on top of the active region 3.2, the upper cladding layer 3.1 consists of p-doped lattice-matched $(Al_yGa_{1-y})InP$ with a band gap higher than that of the active region 3.2 and comparable to the lower cladding layer 3.3.

As a special embodiment of the layered heterostructure 2B, FIG. 6 represents a superlattice of alternating layers of p-doped GaP and AlP. Since this material system has a smaller lattice constant than GaAs or $(Al_xGa_{1-x})InP$, a transition layer 3.0 of $Al_kGa_lIn_mP$ (where $0 \leq k, l, m \leq 1$ and $k+l+m=1$) is first thinly grown on the upper cladding layer 3.1, to transition to and establish the new lattice constant. Then the layered heterostructure 2B is applied as a superlattice in alternating paired layers of p-doped GaP and AlP.

The lateral current spreading effect achieved by the layered heterostructure 2B shown in FIG. 6 is equivalent to or even so much better than that achieved by the much thicker window layer 2A of p-doped GaP shown in FIG. 5, that the thick window layer can be omitted. The relative thickness of the layered heterostructure 2B as illustrated in FIG. 6, in comparison to the single thick window layer 2A illustrated in FIG. 5, is intended to be roughly proportional.

The layered heterostructure 2B comprising alternating layers of GaP and AlP can be very simply realized or produced. This is true since the chemical elemental components, namely Ga, Al, and P, of these layers are already needed and available for producing the other semiconductor layers, namely because the active layers comprise all of these same elemental components Ga, Al, and P. Thus, in order to form the layered heterostructure 2B over the active material, it is simply necessary to continue and appropriately control the epitaxial process being carried out for forming the active layer or layers, with no other adaptations of the equipment or the process. Basically, the layered heterostructure can also be formed of respective layers having different proportional compositions of the same compound semiconductor, as long as the necessary energy band discontinuity is achieved along the heterojunctions. Moreover, the basic elemental components do not all need to appear in common in any single layer, but instead may occur separately in several different layers, with the overall result that one common set of elemental components is used overall for the epitaxial process. Namely, for each layer, a particular subset of the total set of available elemental components can be selected while carrying out the epitaxial process.

While the illustrated example embodiments relate to a current injection surface 1' of a contact 1, the inventive layered heterostructure for current spreading also applies to other applications involving a current collecting electrode or involving an electrode arranged internally within a semiconductor structure. Basically, the inventive arrangement can be applied to any situation in which an improved or more uniform lateral current spreading is needed between an active surface and an electrode that is either smaller or larger than the active surface.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A semiconductor device comprising:
   an active region with an active surface;
   an electrode with an electrode surface having a different surface area than said active surface; and
   a layered semiconductor heterostructure arranged between said electrode surface and said active surface and adapted to conduct and laterally spread an electrical current between said electrode surface and said active surface;
   wherein said heterostructure comprises a plurality of layer pairs that each respectively include a first semiconductor layer comprising a first semiconductor material and a second semiconductor layer comprising a second semiconductor material different from said first semiconductor material;
   wherein said first and second semiconductor layers of each one of said layer pairs are arranged adjoining one another along a respective heterojunction formed therebetween;

wherein one of said first and second layers of each one of said layer pairs includes a majority charge carrier enrichment region adjacent said heterojunction as well as a non-enriched region; and wherein said first and second semiconductor materials respectively have different energy band gaps and exhibit a majority charge carrier energy band discontinuity across said heterojunction.

2. The semiconductor device according to claim 1, wherein said surface area of said electrode surface is smaller than that of said active surface, said electrode surface and said active surface extend parallel to each other, and said first and second semiconductor layers extend parallel to each other.

3. The semiconductor device according to claim 1, wherein said electrode is a current injection electrode and said electrode surface is a current injection surface adapted to supply a current through said heterostructure to said active region, which is a current sink region.

4. The semiconductor device according to claim 3, wherein said device is a light emitting diode and said active region is a light emitting region.

5. The semiconductor device according to claim 1, wherein said electrode is a current collecting electrode and said electrode surface is a current collecting surface adapted to collect a current flowing through said heterostructure from said active region, which is a current emitting source region.

6. The semiconductor device according to claim 5, wherein said device is a photovoltaic cell and said active region is a photovoltaic current emitting region.

7. The semiconductor device according to claim 1, wherein said electrode is arranged on an external surface of said semiconductor device.

8. The semiconductor device according to claim 1, wherein said electrode is arranged internally embedded within said semiconductor device.

9. The semiconductor device according to claim 1, wherein said heterostructure is transparent at least to visible light.

10. The semiconductor device according to claim 1, wherein one of said first and second semiconductor materials comprises at least one elemental component that is not included in the other of said first and second semiconductor materials.

11. The semiconductor device according to claim 1, wherein said first and second semiconductor materials respectively comprise the same compound semiconductor elemental components in different proportions.

12. The semiconductor device according to claim 1, wherein said first and second semiconductor materials both respectively contain an isotypic dopant of either n-type or p-type.

13. The semiconductor device according to claim 1, wherein one of said semiconductor materials contains an n-type dopant and the other of said semiconductor materials contains a p-type dopant.

14. The semiconductor device according to claim 1, wherein said first semiconductor material comprises AlP and said second semiconductor material comprises GaP.

15. The semiconductor device according to claim 14, wherein said active region comprises AlGaInP.

16. The semiconductor device according to claim 1, wherein said active region comprises at least one layer and consists of a finite set of elemental components, and wherein said first and second semiconductor materials respectively consist of one or more respective elemental components selected from said finite set.

17. The semiconductor device according to claim 1, wherein said heterostructure comprises at least four of said layer pairs.

18. The semiconductor device according to claim 1, wherein said heterostructure includes from 10 to 20 and not more than 20 of said layer pairs.

19. The semiconductor device according to claim 1, wherein each one of said semiconductor layers respectively has a thickness in a range from 20 nm to 200 nm, and wherein said heterostructure has a total thickness not exceeding 5 $\mu$m.

20. The semiconductor device according to claim 19, wherein said total thickness of said heterostructure does not exceed about 1 $\mu$m.

21. The semiconductor device according to claim 1, wherein said heterostructure has a total thickness not exceeding 5 $\mu$m.

22. The semiconductor device according to claim 21, wherein said total thickness is about 1 $\mu$m.

23. The semiconductor device according to claim 1, wherein said majority charge carrier energy band discontinuity has a magnitude of at least 150 meV.

24. The semiconductor device according to claim 1, wherein said majority charge carrier energy band discontinuity reaches or exceeds the equilibrated Fermi level of said first and second semiconductor materials.

25. The semiconductor device according to claim 1, wherein said majority charge carrier enrichment region is a first enrichment region located in said first semiconductor layer and extending entirely along said heterojunction, wherein said first semiconductor layer further includes another majority charge carrier enrichment region extending entirely along a side of said first semiconductor layer opposite and parallel to said first enrichment region, and wherein said second semiconductor layer comprises at least one majority charge carrier depletion region extending entirely along said heterojunction opposite said first enrichment region.

26. The semiconductor device according to claim 1, wherein said device is a light emitting diode, said electrode is a current injection contact, said electrode surface is a current injection surface, said current injection surface and said active surface extend parallel to each other, said current injection surface has a smaller surface area than said active surface, said active region is an optically active light emitting region, said active region comprises an active semiconductor material having at least one active region band gap, and said first and second semiconductor materials of said heterostructure have at least one heterostructure band gap with a higher energy level than said at least one active region band gap.

27. The semiconductor device according to claim 26, wherein said first and second semiconductor materials both respectively contain an isotypic dopant of either n-type or p-type.

28. The semiconductor device according to claim 26, wherein said active region comprises a Bragg reflector structure, a bottom cladding layer arranged on said Bragg reflector structure, at least one optically active layer arranged on said bottom cladding layer, a top cladding layer arranged on said at least one optically active layer, and a lattice-matching layer arranged on said top cladding layer, and wherein said heterostructure is a superlattice of said plurality of said layer pairs arranged on said lattice-matching layer.

29. The semiconductor device according to claim 28, wherein said active region consists of a finite set of elemental components, and wherein said first and second semiconductor materials respectively consist of one or more respective elemental components selected from said finite set.

30. The semiconductor device according to claim 26, wherein said heterostructure has a total thickness not exceeding 5 µm.

31. The semiconductor device according to claim 1, wherein said heterostructure has a total thickness less than 5 µm.

32. The semiconductor device according to claim 1, wherein said heterostructure has a total thickness not exceeding 4 µm.

33. The semiconductor device according to claim 1, wherein said heterostructure is further adapted to conduct and laterally spread an electrical current between said electrode surface and said active surface particularly with a discontinuous stepped current spreading characteristic including a relatively higher rate of lateral current spreading in each said enrichment region and a relatively lower rate of lateral current spreading in each said non-enriched region.

* * * * *